United States Patent
Kwon et al.

(10) Patent No.: US 8,241,988 B2
(45) Date of Patent: Aug. 14, 2012

(54) PHOTO KEY AND METHOD OF FABRICATING SEMICONDUCTOR DEVICE USING THE PHOTO KEY

(75) Inventors: Byoung-ho Kwon, Hwaseong-si (KR); Chang-ki Hong, Seongnam-si (KR); Bo-un Yoon, Seoul (KR); Jae-dong Lee, Seongnam-si (KR); Sang-jin Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/204,752

(22) Filed: Aug. 8, 2011

(65) Prior Publication Data

US 2011/0294285 A1    Dec. 1, 2011

Related U.S. Application Data

(62) Division of application No. 12/475,713, filed on Jun. 1, 2009, now Pat. No. 8,018,078.

(30) Foreign Application Priority Data

Sep. 9, 2008  (KR) .................. 10-2008-0088918

(51) Int. Cl.
*H01L 21/76* (2006.01)
*H01L 21/00* (2006.01)
*H01L 21/66* (2006.01)
*G01R 31/26* (2006.01)

(52) U.S. Cl. ... 438/401; 438/14; 438/462; 257/E23.179; 257/E21.53

(58) Field of Classification Search .................. 257/797, 257/E23.179, E21.53; 438/14, 401, 462
See application file for complete search history.

(56) References Cited

U.S. PATENT DOCUMENTS

| | | | |
|---|---|---|---|
| 5,710,063 A | 1/1998 | Forehand et al. | |
| 5,904,563 A | 5/1999 | Yu | |
| 6,778,424 B2 * | 8/2004 | Iwata et al. | 365/149 |
| 7,288,461 B2 | 10/2007 | Chia et al. | |
| 2008/0157384 A1 | 7/2008 | Jeon | |
| 2008/0203590 A1 | 8/2008 | Kang et al. | |

FOREIGN PATENT DOCUMENTS

| | | |
|---|---|---|
| KR | 1020070069841 A | 7/2007 |
| KR | 1020070077691 A | 7/2007 |
| KR | 1020080004208 A | 1/2008 |

\* cited by examiner

*Primary Examiner* — Michelle Mandala
(74) *Attorney, Agent, or Firm* — Volentine & Whitt, PLLC

(57) ABSTRACT

A photo key has a plurality of first regions spaced apart from one another on a semiconductor substrate, and a second region surrounding the first regions, and one of the first regions and the second region constitutes a plurality of photo key regions spaced apart from one another. Each of the photo key regions includes a plurality of first conductive patterns spaced apart from one another; and a plurality of second conductive patterns interposed between the first conductive patterns.

20 Claims, 14 Drawing Sheets

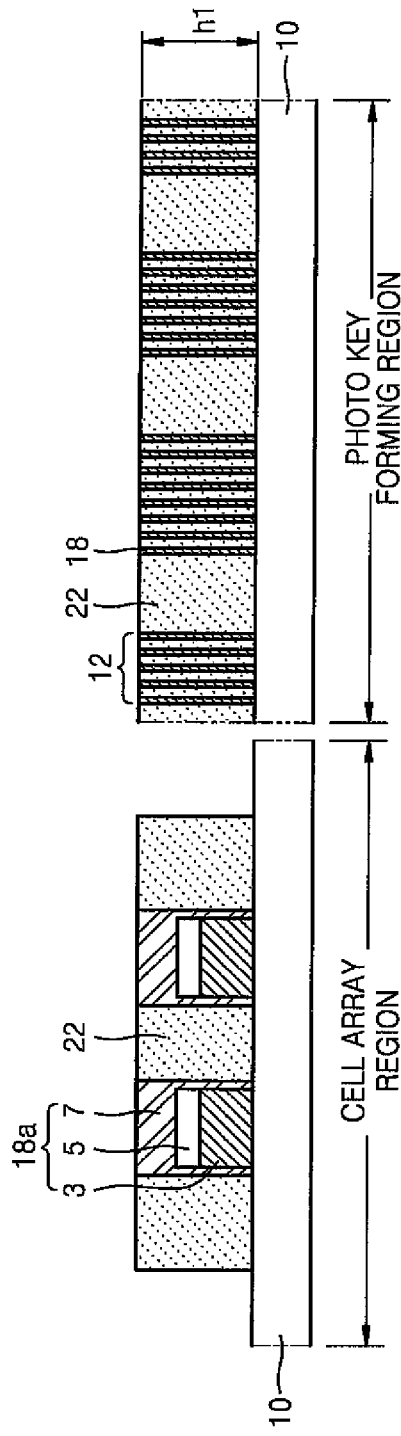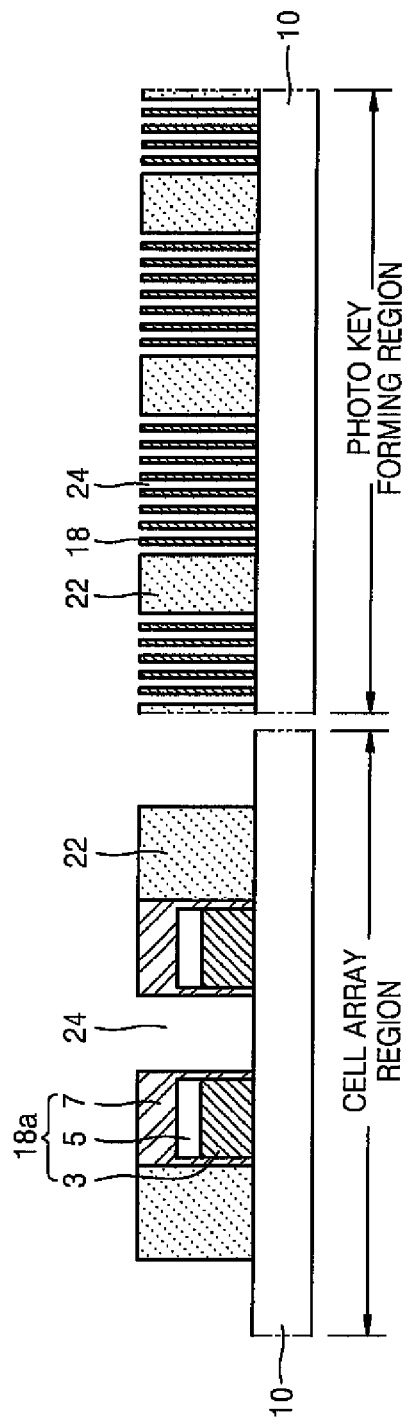

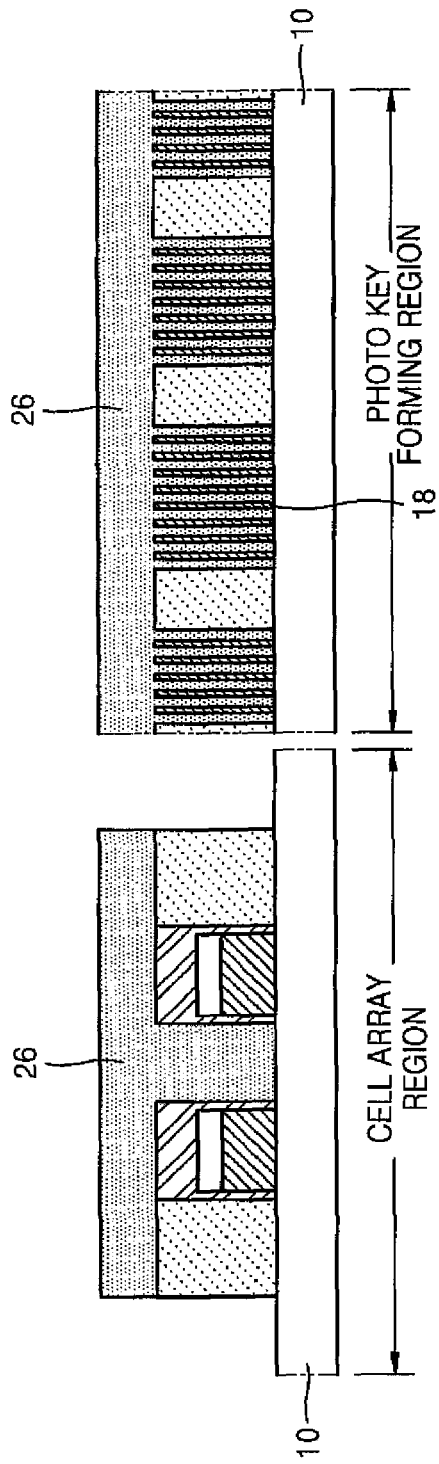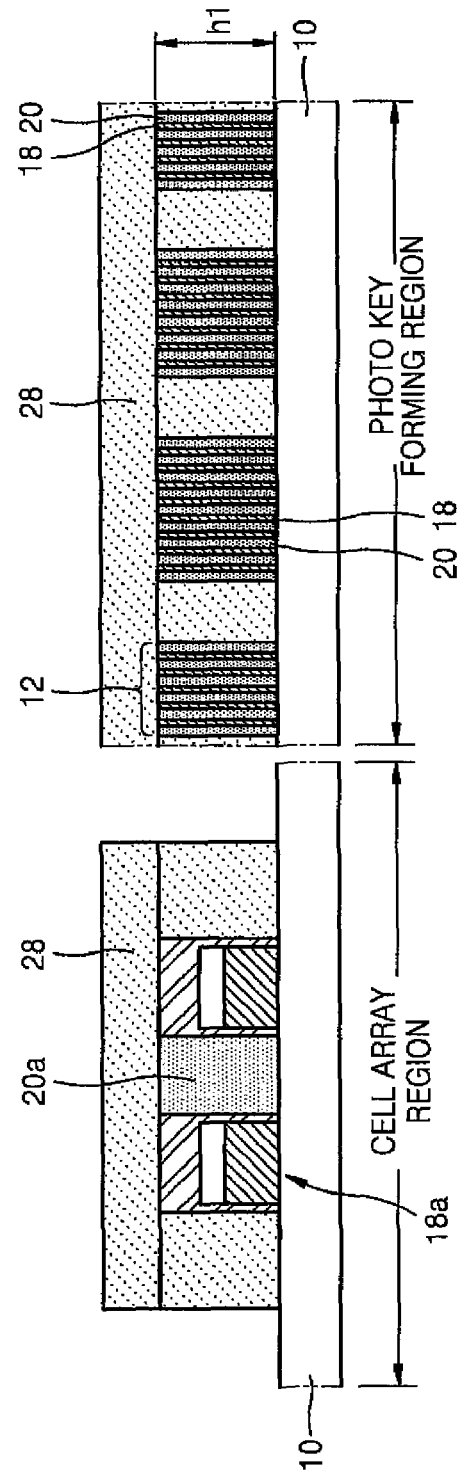

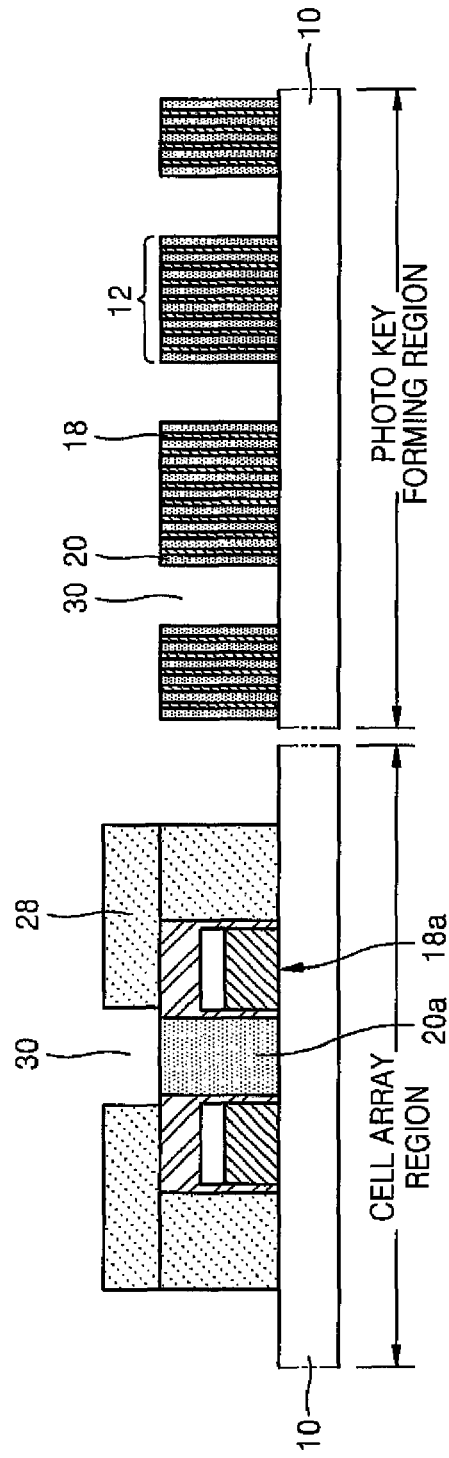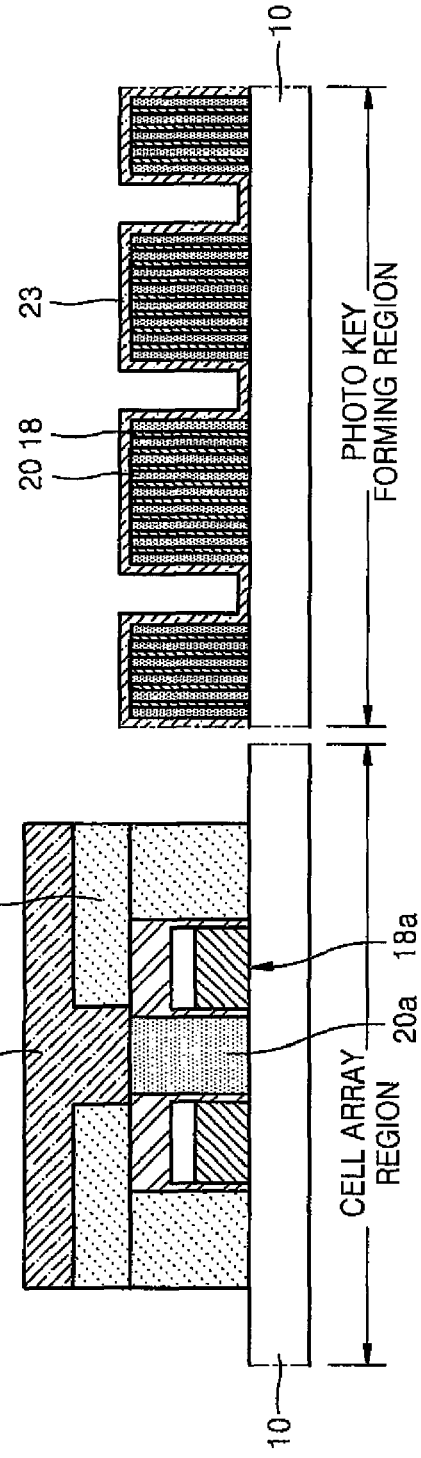

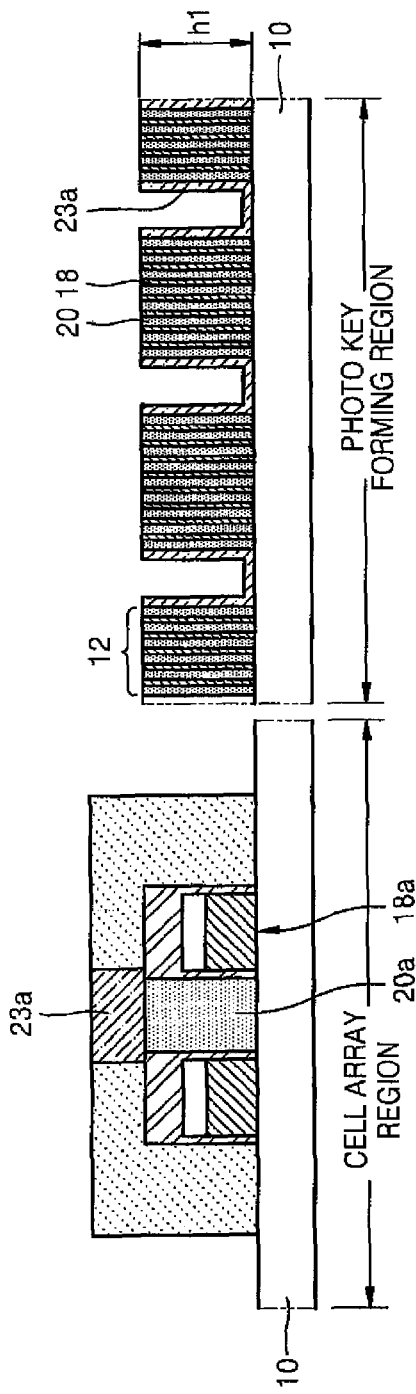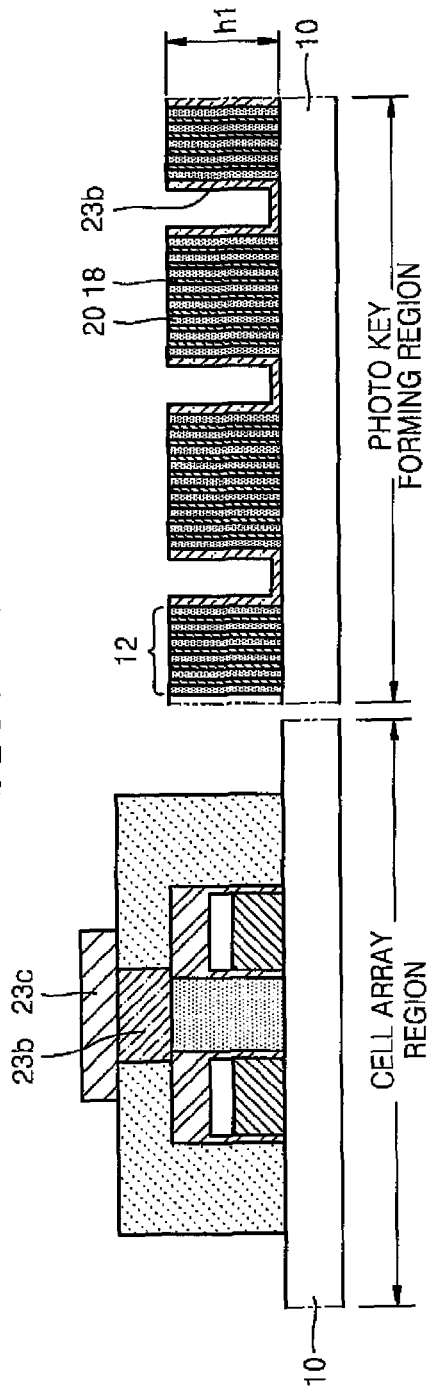

PHOTO KEY AND METHOD OF FABRICATING SEMICONDUCTOR DEVICE USING THE PHOTO KEY

CROSS-REFERENCE TO RELATED APPLICATIONS

This is a divisional of application Ser. No. 12/475,713, filed Jun. 1, 2009, which is incorporated herein by reference in its entirety.

BACKGROUND OF THE INVENTION

Field of the Invention

The present invention relates to the process of photolithography used in the manufacturing of semiconductor devices and the like. More particularly, the present invention relates to a photo key, used to align a substrate during photolithography, and to a method of fabricating a semiconductor device using such a photo key.

A semiconductor device is fabricated, in part, by repeatedly and sequentially forming a layer of predetermined material on a semiconductor substrate, e.g., a semiconductor wafer, and subsequently forming a desired pattern on the substrate by subjecting the layer of predetermined material to photolithography. Photolithography involves forming a photoresist layer on the layer of predetermined material, exposing the photoresist layer using a mask (hereinafter generally referred to as an exposure mask), developing the exposed photoresist layer to form a photoresist pattern, and etching the layer of predetermined material using the photoresist pattern as a mask. All of these processes, especially the exposure process, are important with regard to the quality of the semiconductor device that is ultimately fabricated.

The exposure mask used in the exposure process bears a mask pattern. An image of the mask pattern is transferred to the photoresist layer by irradiating the photoresist layer through the exposure mask during the exposure process. Hence, the predetermined pattern formed on the substrate by the developing and etching processes correspond to the mask pattern.

Furthermore, an alignment pattern is used to align the exposure mask with the semiconductor substrate during the initial exposure process. The alignment pattern is a predetermined photo key formed on the semiconductor substrate. An overlay pattern is another type of photo key formed on the semiconductor substrate. The overlay pattern is used to align each pattern formed on the semiconductor substrate with the next pattern to be formed during the photolithographic processes repeated in the manufacturing of the semiconductor device.

However, as the semiconductor device is being fabricated, the heights of the photo keys are reduced. Thus, exposure equipment eventually fails to read an optical signal produced from the photo keys. At this time, the equipment can no longer carry out a reliable exposure process.

SUMMARY OF THE INVENTION

An object of the present invention is to provide a photo key on a semiconductor substrate, whose height is not reduced during the manufacture of a semiconductor device on the substrate.

Another object of the present invention is to provide a reliable method of fabricating a semiconductor device using a photo key.

According to an aspect of the present invention, there is provided the combination of a semiconductor substrate and photo key, in which the photo key includes conductive patterns that have the same structural form (height and composition) as a component(s) of the semiconductor device.

The photo key has a plurality of first regions spaced apart from one another in a given direction substantially parallel to the plane of the substrate, and a second region surrounding each of the first regions. One of the first regions and the second region constitutes photo key regions spaced apart from one another in the given direction. Furthermore, each of the photo key regions is made up of first conductive patterns arrayed in at least a first direction substantially parallel to the plane of the substrate, and second conductive patterns each of a composition different from that of the first conductive patterns. Respective ones of the second conductive patterns are interposed between respective ones of the first conductive patterns. Also, second conductive patterns are disposed outside the first conductive patterns in each photo key region.

Each of the photo key regions may have a first photo key sub-region made up of respective ones of the first conductive patterns and second conductive patterns, and a second photo key sub-region adjacent to the first photo key sub-region and made up of other respective ones of the first conductive patterns and devoid of the second conductive patterns. The region of the photo key between the photo key regions, namely a peripheral region of the photo key, is occupied by an insulating layer. The photo key regions may collectively have a surface area less than or greater than that of the peripheral region, but preferably greater than that the peripheral region so as to be less likely to become shorter as the semiconductor device is fabricated.

According to another aspect of the inventive concept, the first and second conductive patterns may be a plurality of dummy gate patterns, and a plurality of dummy pad patterns, respectively.

According to yet another aspect of the present invention, there is provided a method for use in the fabricating of a semiconductor device and which method includes using the process of fabricating components of transistors in a cell array region to form conductive patterns of a photo key, and subsequently using the photo key to fabricate further components of the transistors.

First, gate patterns are formed on a cell array region of a semiconductor substrate. At the same time, dummy gate patterns are formed on a photo key forming region of the substrate located outside and extending along the periphery of the cell array region.

Next, a first insulating layer is formed over the substrate to such a thickness as to bury the gate patterns and the photo key regions. The first insulating layer is then chemically mechanically polished using the gate patterns and the dummy gate patterns as an etch stop layer. A photolithography-based process is then performed to remove the insulating layer from between the gate patterns and from the photo key regions. In the photolithography-based process, light is directed towards the photo key forming region of the substrate, that portion of the light which is transmitted as an optical signal from the photo key region is analyzed, and exposure apparatus of photolithographic equipment is aligned with the substrate on the basis of the analysis of the optical signal.

Subsequently, a conductive layer is formed over the substrate. The conductive layer is then planarized to simultaneously form a conductive pad pattern between the gate patterns on the cell array region of the substrate, and second conductive patterns between the first conductive patterns in the photo key regions.

According to still another aspect of the inventive concept, there is provided a method of fabricating a semiconductor device in which a photo key made up of both dummy gate patterns and dummy pad patterns is used as a transmissive photo key and a stepped photo key.

Gate patterns are formed on a cell array region of a semiconductor substrate. A conductive pad pattern is formed on the cell array region and between the gate patterns. The dummy gate patterns are formed in each of photo key regions spaced apart from one another on a photo key forming region of the substrate, and the dummy pad patterns are formed between the dummy gate patterns in each of the photo key regions. The photo key forming region of the substrate is located outside and extends along the periphery of the cell array region. In addition, a first insulating layer that insulates the gate patterns and the photo key regions is formed.

The gate patterns on the cell array region of the substrate and the dummy gate patterns on the photo key forming region of the substrate are preferably formed by the same process. The first insulating layer may be formed by forming an insulating material layer between the gate patterns, the dummy gate patterns, and the photo key regions and performing a chemical-mechanical polishing (CMP) of the insulating material layer using the gate patterns and the dummy gate patterns as an etch stop layer.

The conductive pad pattern and the dummy pad patterns may be formed by etching the first insulating layer to form holes that expose respective portions of the semiconductor substrate in the cell array region and the photo key regions, then filling the holes with conductive material to form a conductive layer, and finally performing a CMP process on the conductive layer using the gate patterns and the dummy gate patterns as an etch stop layer.

The method further includes forming a second insulating layer on the conductive pad pattern, the gate patterns, the first insulating layer, and the photo key regions, and performing a photolithography-based process on the second insulating layer to form a contact hole which exposes the conductive pattern formed between the gate patterns. The photolithography-based process uses the photo key, comprising the photo key regions made up of the dummy gate patterns and the dummy pad patterns, as a transmissive photo key.

The method further includes etching away the second insulating layer from atop the photo key regions and etching away the first insulating layer from in between the photo key regions to expose the photo key regions. Subsequently, a conductive layer is formed so as to fill the contact hole in the cell array region and so as to conformally cover the photo key regions. Subsequently, a second photolithography-based process is performed using the photo key as a stepped photo key.

The second photolithography-based process may be performed on the conductive layer to form a conductive line on the conductive pad pattern between the gate patterns.

Alternatively, the conductive layer may be chemically mechanically polished using the gate patterns and the dummy gate patterns as an etch stop layer to form a conductive plug on the conductive pad pattern, and to form a conductive pattern outside the photo key regions on the photo key forming region of the substrate. Next, a second conductive layer is formed over the conductive plug and the photo key forming region. In this case, the second photolithography-based process forms, from the second conductive layer, a second conductive line on the conductive plug.

In the present invention as described above, the conductive patterns are formed or inserted into each of the photo key regions. Accordingly, the height of the photo key regions is prevented from being reduced during a subsequent semiconductor device manufacturing process such as a chemical-mechanical polishing (CMP) process.

BRIEF DESCRIPTION OF THE DRAWINGS

These and other objects, features and advantages of the present invention will be more clearly understood from the following detailed description taken in conjunction with the accompanying drawings in which:

FIGS. 15 through 21 are each a cross-sectional view of a substrate, and together illustrate a method of fabricating a semiconductor device using a photo key according the present invention; and FIG. 22 is also a cross-sectional view of a substrate, for use in explaining another embodiment of a method of fabricating a semiconductor device using a photo key according to the present invention.

DETAILED DESCRIPTION OF THE PREFERRED EMBODIMENTS

Figure 1:
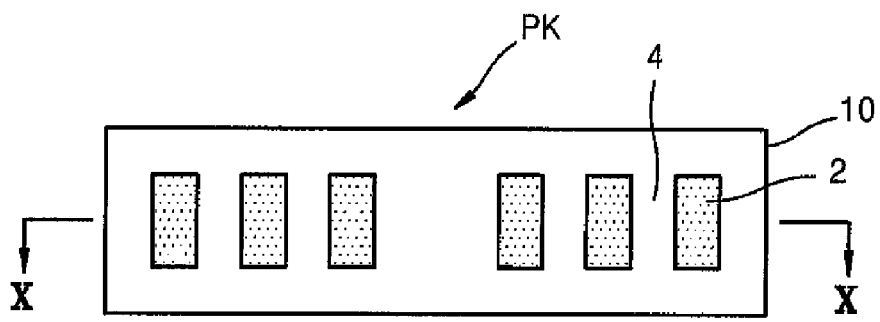
FIG. 1 is a plan view of an embodiment of a photo key according to the present invention.

The present invention will now be described more fully with reference to the accompanying drawings. Like reference numerals denote like elements throughout the drawings. Also, in the detailed description and claims, the term "pattern" is used to denote a feature, e.g., a line feature, whose individual form is repeated (in the photo key).

Referring to FIG. 1, a photo key PK is disposed on a semiconductor substrate 10, e.g., a semiconductor wafer. The semiconductor wafer may be a silicon wafer. The photo key PK may be formed along a stripe (e.g., along a scribe line) where no cell is formed during the manufacturing of a semiconductor device from the wafer. The photo key PK has a length on the order of hundreds of micrometers (μm) in a first direction (X-X direction) and a width on the order of tens of micrometers (μm) in a second direction perpendicular to the first direction (both directions extending essentially parallel to the plane of the wafer).

Figure 2:
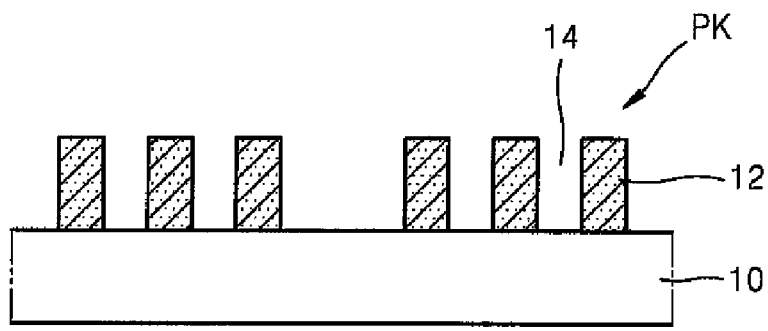
FIG. 2 is a cross-sectional view taken along line X-X of FIG. 1.
Figure 3:
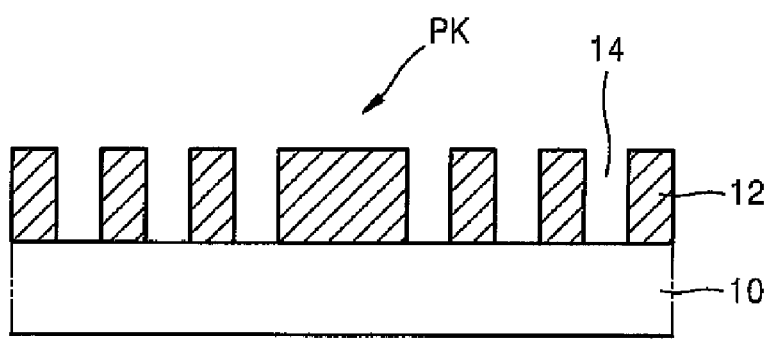
FIG. 3 is a cross-sectional view of another form of a photo key according to the present invention, and taken along a line corresponding to line X-X of FIG. 1.

The photo key PK includes a plurality of first regions 2 spaced apart from one another on the semiconductor substrate 10 along the first direction (X-X direction) and a second region 4 surrounding the first regions 2. The first regions 2 collectively have an area less than that of the second region 4. The first regions 2 may be photo key regions 12 and the second region 4 may be a peripheral region 14 (FIG. 2 described below). In other words, the photo key regions 12 are formed in the first regions 2, and the peripheral region 14 surrounding the photo key regions 12 corresponds to the second region 4. Alternatively, the second region 4 may be a photo key region 12 such that the photo key region 12 is contiguous (FIG. 3). In either case, though, the photo key PK will be described as having individual photo key regions 12, namely, regions 12 seen as being spaced from each other in a sectional view of the photo key.

The photo key PK of FIG. 3 is thus a negative of the photo key PK of FIG. 2. Therefore, the photo key regions 12 of the photo key PK of FIG. 3 occupy a comparatively greater area than those of the photo key PK of FIG. 2. Accordingly, the photo key PK of FIG. 3 is more effective than the photo key PK of FIG. 2 in preventing the height of the photo key regions 12 from being reduced during a semiconductor device manufacturing process, for example, a CMP process, as will be explained in more detail later on.

Figure 4:
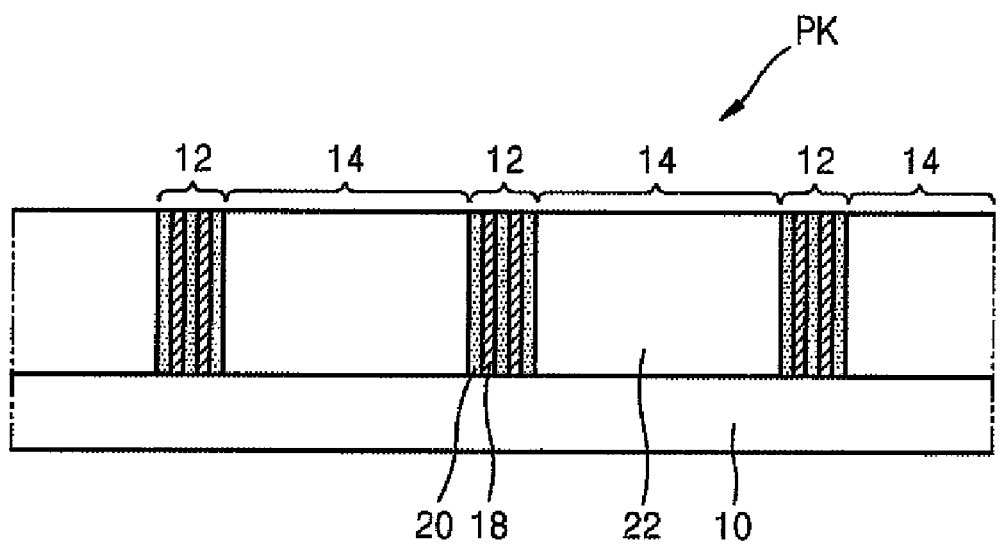
FIG. 4 is an enlargement of part of the cross-sectional view of the photo key shown in FIG. 2.
Figure 5:
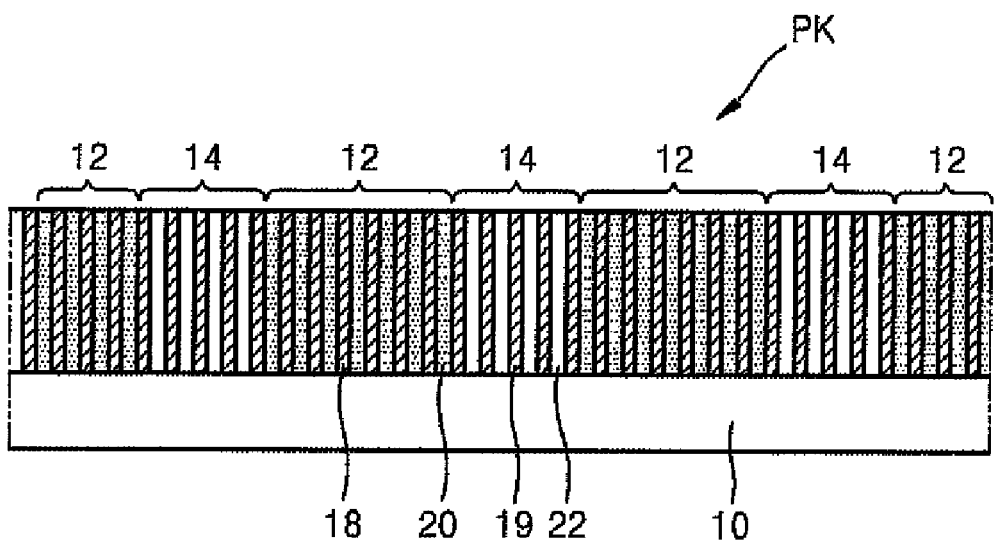
FIG. 5 is an enlargement of part of the cross-sectional view of the photo key shown in FIG. 3.

Referring to FIGS. 4 and 5, the photo key regions 12 are spaced apart from one another along the semiconductor substrate 10, and the peripheral region 14 extends between the photo key regions 12 of each adjacent pair. For convenience of explanation, three photo key regions 12 are illustrated in FIG. 4, and four photo key regions 12 are illustrated in FIG. 5.

Each of the photo key regions 12 includes a plurality of first conductive patterns 18 spaced apart from one another along an X-axis (corresponding to the axis X-X in FIG. 1) and a plurality of second conductive patterns 20 interposed between the first conductive patterns 18 and disposed outside the set of first conductive patterns 18 with respect to the X-axis. More specifically, a respective second conductive pattern 20 is interposed between the first conductive patterns 18 of each adjacent pair, and the entire set of first conductive patterns 18 is sandwiched between a pair of the second conductive patterns 18. The first conductive patterns 18 may be dummy patterns of polysilicon used to form a gate, and the second conductive patterns 20 may be dummy patterns of polysilicon used to form a pad. In this case, for example, the photo key 12 is formed as a dynamic random access memory (DRAM) is fabricated on a wafer.

In the embodiment of FIG. 4, and as is also evident from FIG. 2, the photo key regions 12 occupy a substantially small area than the peripheral region 14 in the photo key PK. The peripheral region 14 may be formed of an insulating layer 22, for example, an oxide layer. In the embodiment of FIG. 5, and as is evident from FIG. 3, the photo key regions 12 occupy a substantially large area than the peripheral region 14 in the photo key PK. Also, the peripheral region 14 is formed of both an insulating layer 22 and third conductive patterns 19 that are spaced apart from one another. The third conductive patterns 19 and the first conductive patterns 18 may be formed of the same material and during the same stage of the manufacturing process.

Thus, again, the example of the photo key PK shown in FIG. 5 is more effective than that shown in FIG. 4 in preventing the height of the photo key regions 12 from being reduced during the fabrication of a semiconductor device on a wafer, even during a CMP process. Furthermore, it should be noted that the present invention is not limited to any particular absolute or relative size of the photo key regions 12 or the peripheral region 14. Also, the peripheral region 14 may be provided with patterns other than those shown in FIG. 5.

Figure 6:
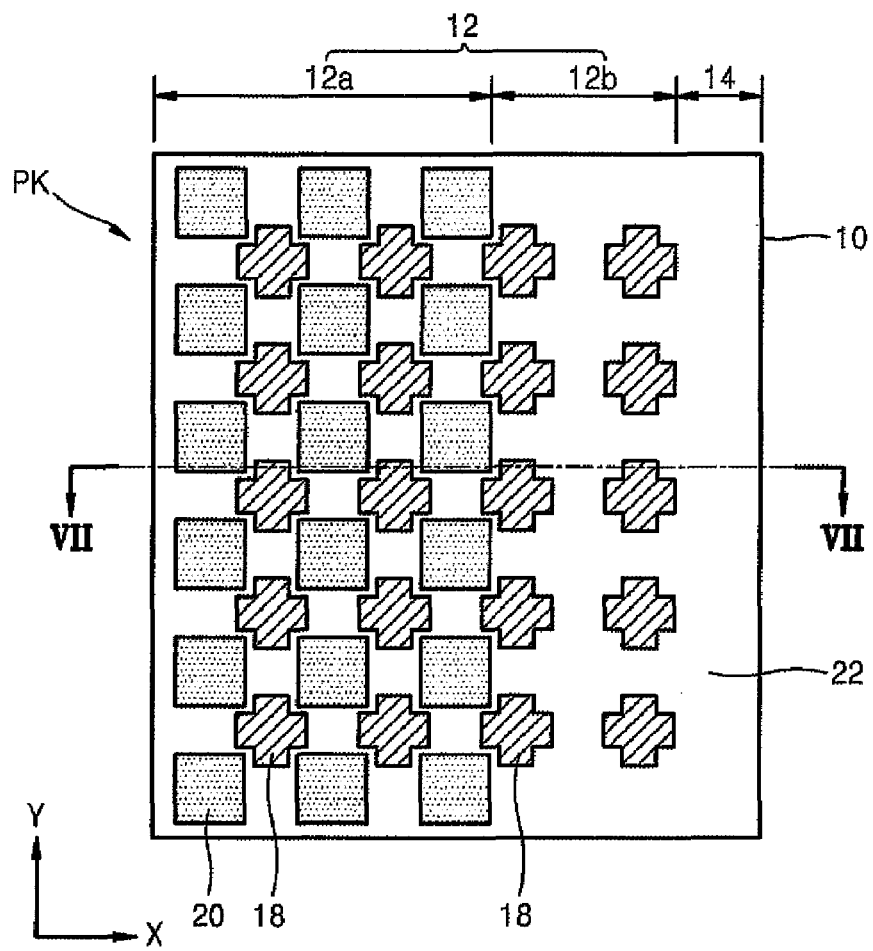
FIG. 6 is a plan view of part of another embodiment of a photo key according to the present invention.
Figure 7:
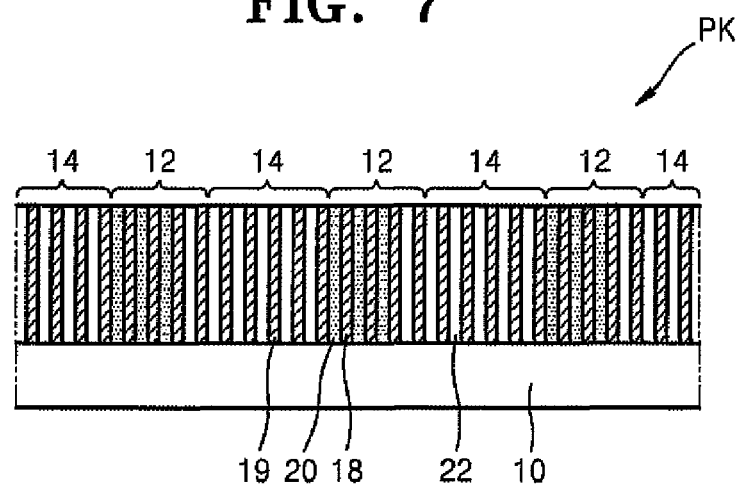
FIG. 7 is a cross-sectional view taken along line VII-VII of FIG. 6.

FIGS. 6 and 7 illustrate part of another embodiment of a photo key PK according to the present invention, which part includes one photo key region 12 and a peripheral region 14 of the photo key PK.

Referring to the plan view of FIG. 6, each photo key region 12 includes a first photo key sub-region 12a extending over a first portion of the semiconductor substrate 10 and a second photo key sub-region 12b extending over a second portion of the semiconductor substrate 10 contiguous with the first portion of the semiconductor substrate 10. Thus, the second photo key sub-region 12b is adjacent to the first photo key sub-region 12a. The first photo key sub-region 12a includes first conductive patterns 18 and second conductive patterns 20, and the second photo key sub-region 12b includes first conductive patterns 18 (i.e., conductive patterns corresponding to the first conductive patterns of the first photo key sub-region 12a) but no other conductive patterns (i.e., no conductive patterns corresponding to the second conductive patterns of the first photo key sub-region 12a).

More specifically, and referring to the sectional view of FIG. 7, the first photo key sub-region 12a includes first conductive patterns 18 spaced apart from one another, and second conductive patterns 20 located between the first conductive patterns 18 and on the outside of the entire set of first conductive patterns 18 similarly to the first embodiment. The peripheral region 14 is formed by an insulating layer 22, and may further include conductive patterns 19, similar to the first conductive patterns 18 of the first photo key sub-region 12a, as is also shown in FIG. 7.

The first conductive patterns 18 and the second conductive patterns 20 in each of the photo key regions 12 may be arranged in various ways in the plane of the semiconductor substrate 10. Referring back to FIG. 6, the first conductive patterns 18 are arrayed on the semiconductor substrate 10 as spaced apart from one another in a first direction (X direction) and a second direction (Y direction) perpendicular to the first direction, and the second conductive patterns 20 are located between the first conductive patterns 18 and are similarly arrayed on the semiconductor substrate 10 as spaced apart from one another in the first (X) and second (Y) directions. The arrangement of the first conductive patterns 18 and the second conductive patterns 20 in each of the photo key regions 12 will be described in more detail later.

When photolithography is performed on a substrate having a photo key configured as shown in FIGS. 6 and 7, exposure equipment transmits laser light onto the photo key PK. The photo key PK is transparent and thus, transmits the laser light. An optical image recognition system picks up the light transmitted by the photo key PK and recognizes the photo key PK based on a difference in the contrast of images of the first photo key sub-region 12a and the second photo key sub-region 12b. For these reasons, the photo key PK of the embodiment of FIGS. 6 and 7 may be referred to as a transmissive photo key.

Figure 8:
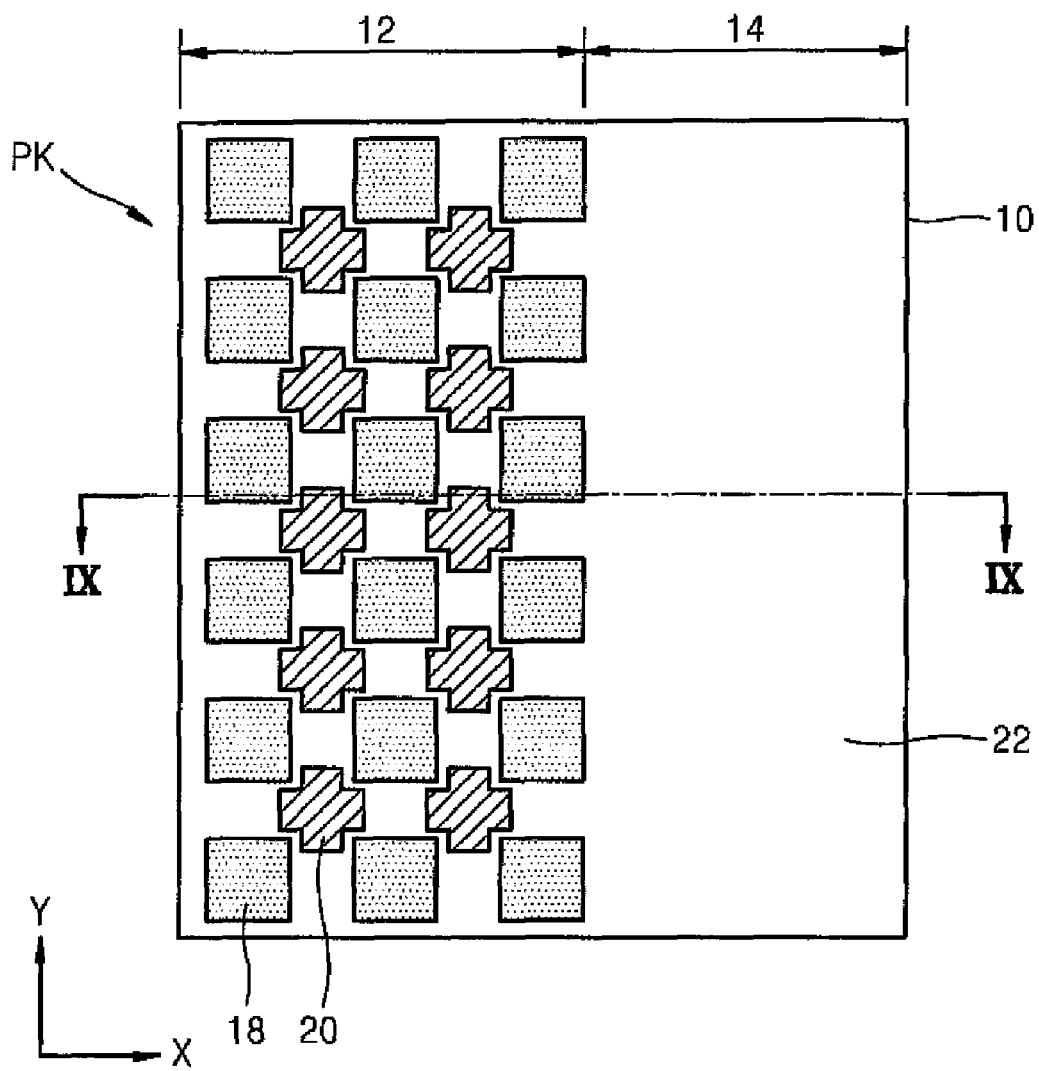
FIG. 8 is a plan view of part of another embodiment of a photo key according to the present invention.
Figure 9A:
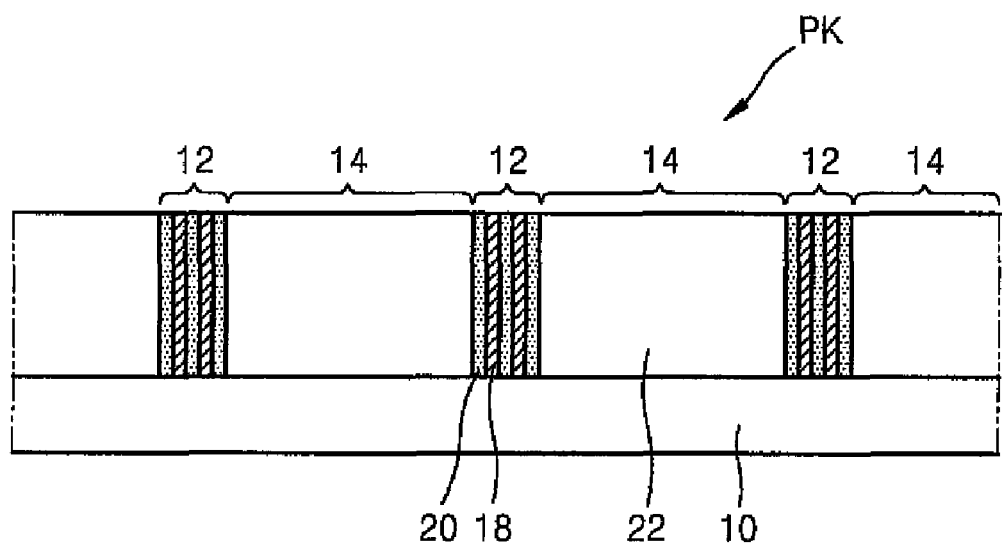
FIG. 9A is a cross-sectional view taken along line IX-IX of FIG. 8.
Figure 9B:
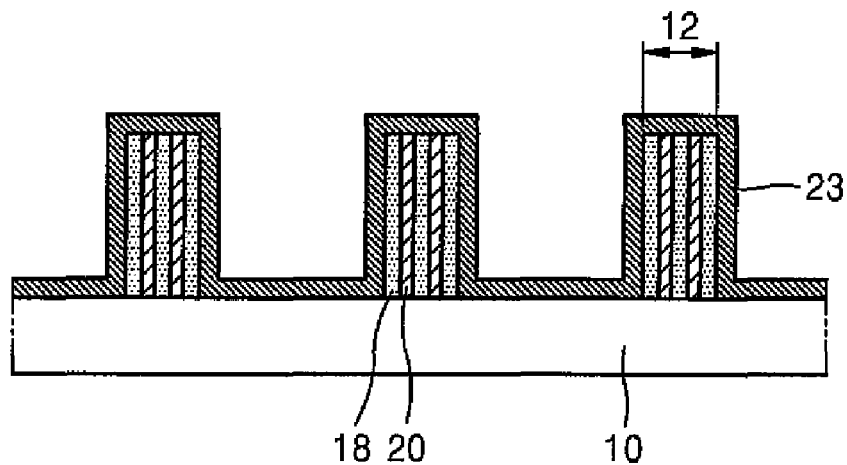
FIG. 9B is a cross-sectional view of part of a photo key for use in explaining how the photo key of FIGS. 8 and 9A can be recognized using an optical signal.

FIGS. 8 and 9A illustrate part of another embodiment of a photo key PK according to the present invention, and which part includes a photo key region 12 and a peripheral region 14 of the photo key. FIG. 9B shows how the photo key PK is recognized using an optical signal.

Referring to the plan view of FIG. 8, each photo key region 12 is disposed adjacent to the peripheral region 14. Also, each photo key region 12 includes first conductive patterns 18 and second conductive patterns 20. In other words, none of the photo key regions 12 of the embodiment of FIG. 8 includes a sub-region similar to the second photo key sub-region 12b of the embodiment of FIG. 6. Rather, each photo key region 12 of the embodiment FIG. 8 has the same configuration as the first photo key sub-region 12a of the embodiment of FIG. 6. Again, the arrangement of the first conductive patterns 18 and the second conductive patterns 20 constituting each of the photo key regions 12 will be explained in more detail later on.

Referring to FIG. 9A, the cross section of each of the photo key regions 12 is similar to that of the photo key regions 12 of the first embodiment as best shown in FIG. 4. That is, each of the photo key regions 12 includes a plurality of first conductive patterns 18 spaced apart from one another and a plurality of second conductive patterns 20 located between and to the outside of the first conductive patterns 18. The peripheral region 14 is constituted by an insulating layer 22, and may further include third conductive patterns 19, similar to the embodiment of FIG. 7, if necessary.

Referring to FIG. 9B, the insulating layer 22 is removed, and then an opaque conductive layer 23, for example, a tungsten layer, is formed over the photo key regions 12 and the peripheral region 14 during the manufacturing of the semiconductor device. In this case, when photolithography is to be carried out on the semiconductor substrate 10 on which the photo key PK having the opaque conductive layer 23 resides, laser light is reflected from the semiconductor substrate 10 and more specifically, from the photo key. An optical recognition system picks up the reflected laser light and recognizes the photo key PK due to a difference in height between the photo key regions 12 and the peripheral region 14. The photo key PK of the embodiment of FIG. 9B may thus be referred to as a stepped photo key.

FIGS. 10 through 14 are plan views illustrating various examples of photo key regions according to the present invention. More specifically, FIGS. 10 through 14 illustrate various other examples of photo key regions, each of which may be substituted for the first photo key sub-region 12a in the embodiment of FIG. 6 or for the photo key region 12 in the embodiment of FIG. 8.

Figure 10:
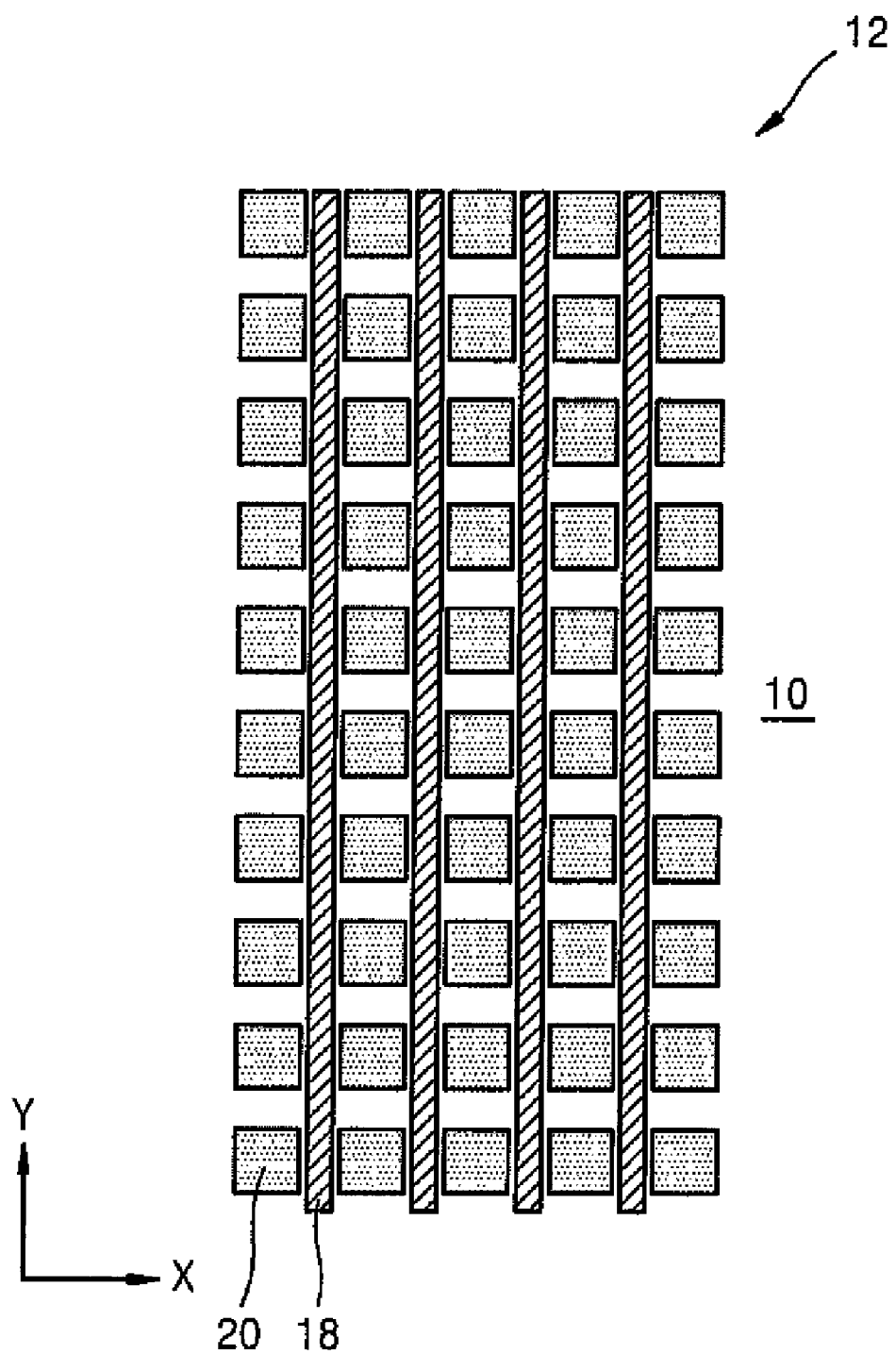
FIGS. 10 through 14 are each a plan view of a respective example of one photo key region of a photo key according to the present invention.

Referring to FIG. 10, each photo key region 12 includes first conductive patterns 18 formed on the semiconductor substrate 10 as spaced apart from one another in a first direction (X direction corresponding to the shorter or widthwise direction of the photo key region) and each of which is a linear pattern extending longitudinally in a second direction (Y direction corresponding to the longer or lengthwise direction of the photo key region) perpendicular to the first direction. Also, each photo key region 12 includes second conductive patterns 20 arrayed in the first and second directions such that a respective set of the second conductive patterns 20 is interposed between first conductive patterns 18 of each adjacent pair and such that the entire group of first conductive patterns 18 is sandwiched between two respective sets of the second conductive patterns 20.

Figure 11:
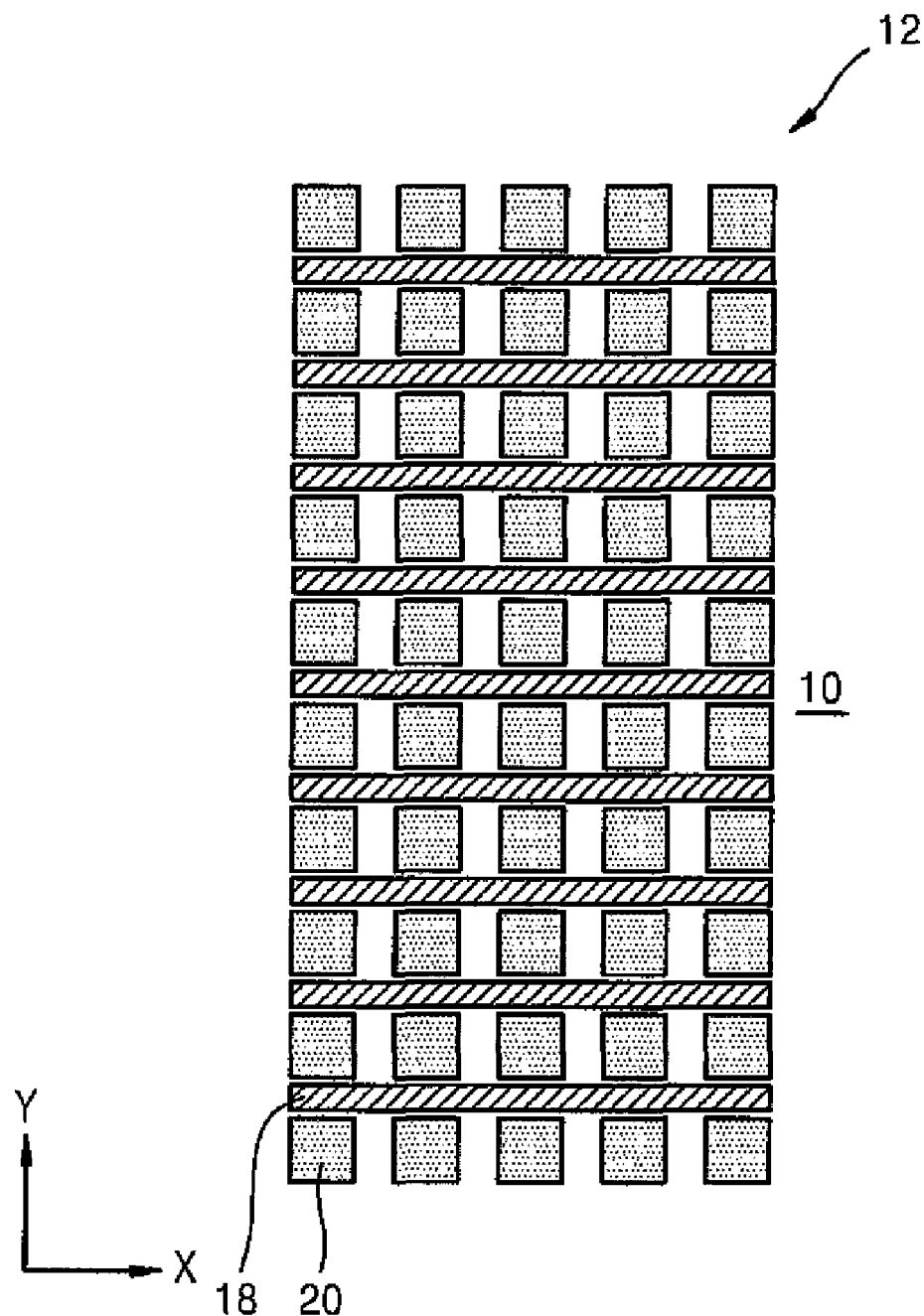
Figure 12:
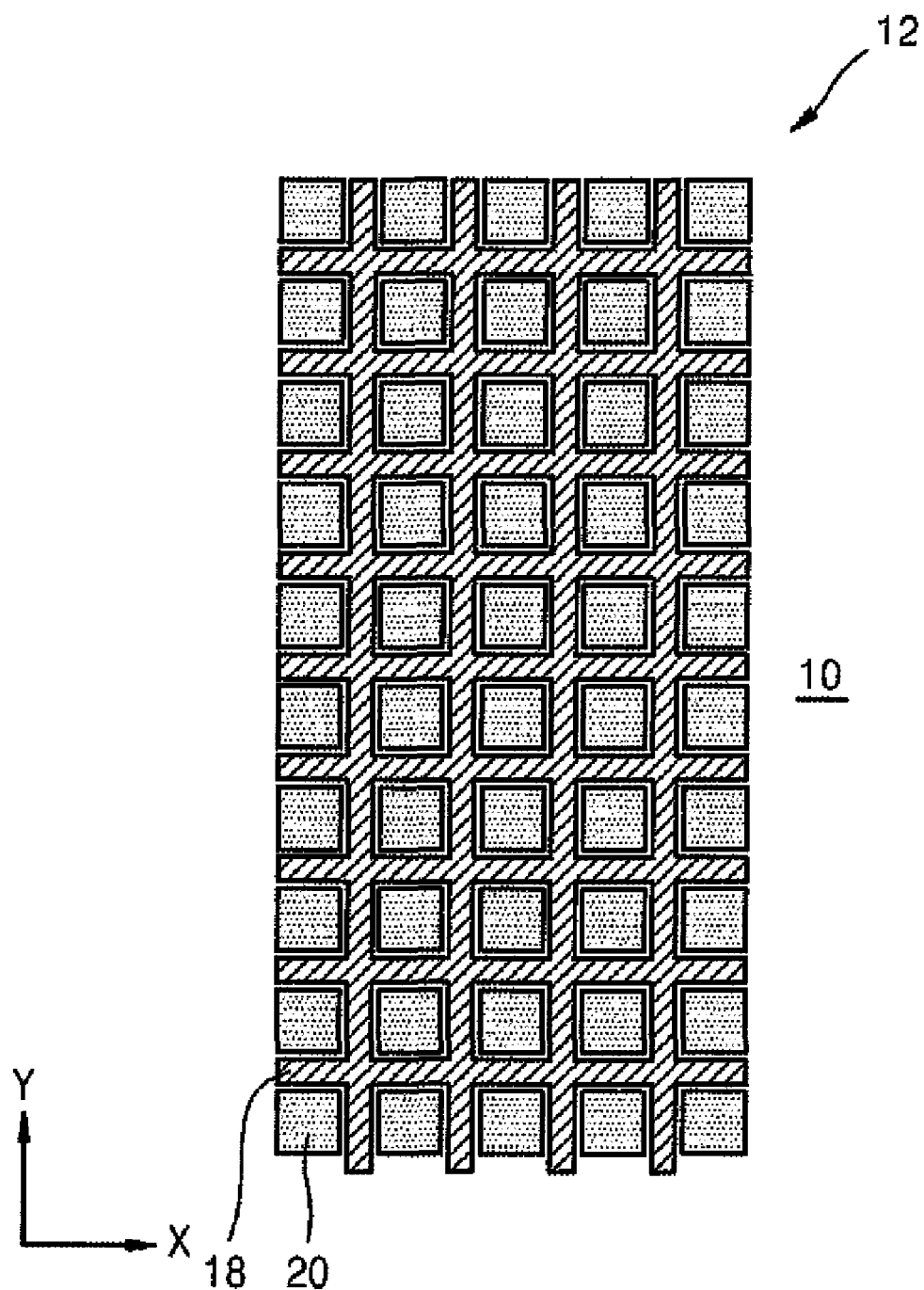

The photo key region 12 in the example of FIG. 11 is essentially the same as the photo key region 12 of the example of FIG. 10 except that the first conductive patterns 18 are spaced apart from one another in the second direction (lengthwise direction of the photo key region) and extend longitudinally in the first direction (widthwise direction of the photo key region). FIG. 12 illustrates an example which is basically a combination of the photo key regions of the examples of FIGS. 10 and 11. The photo key regions 12 of FIG. 12 are respectively the same as the photo key regions 12 of FIGS. 10 and 11 except that the first conductive patterns 18 are formed to be spaced apart from one another in the first and second directions and to extend longitudinally in the first and second directions. That is, the first conductive patterns 18 collectively have the form of a lattice lying substantially parallel to the plane of the wafer.

Figure 13:
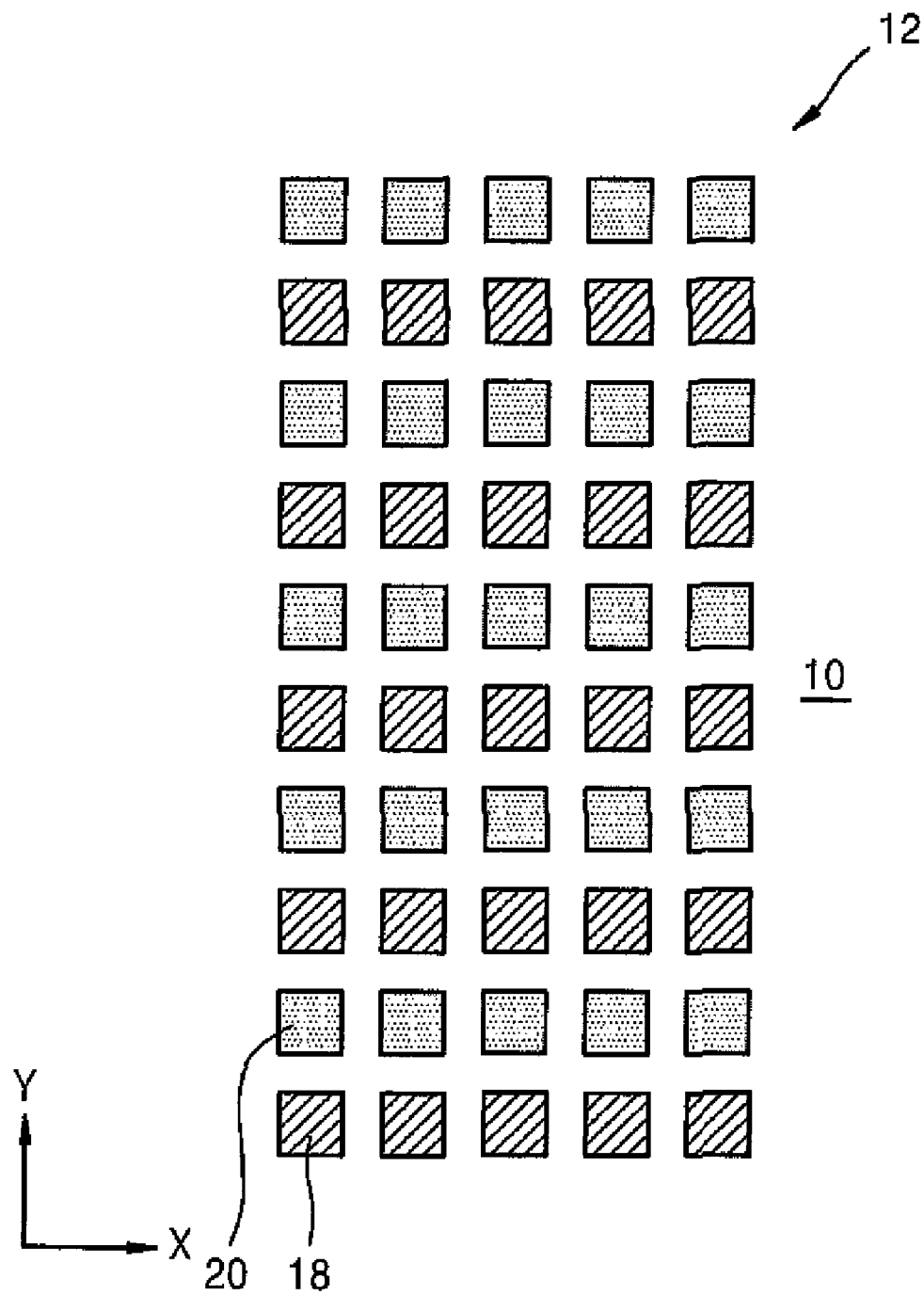
Figure 14:
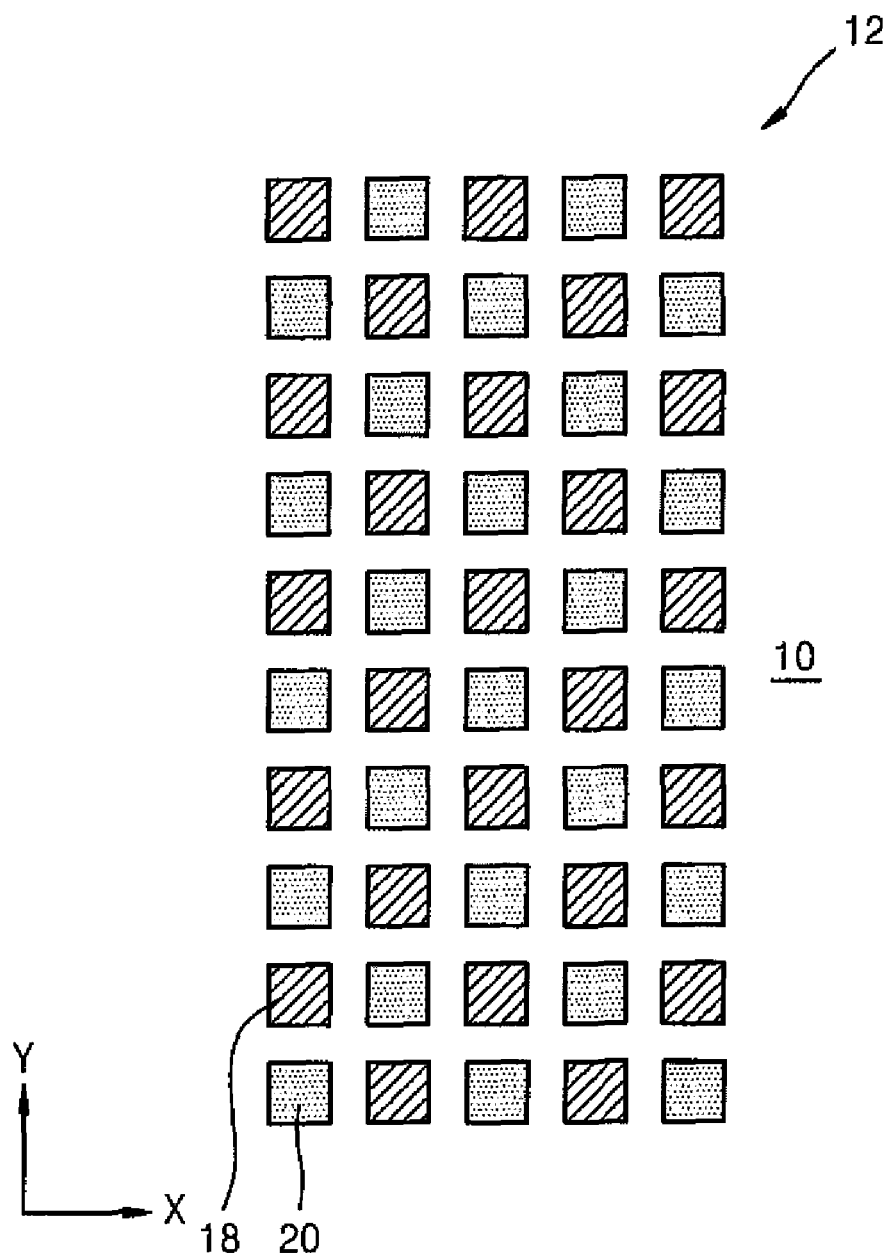

The photo key region 12 of the example of FIG. 13 includes first conductive patterns 18 formed on the semiconductor substrate 10 as spaced apart from one another in first and second directions (X and Y directions perpendicular to one another and substantially parallel to the plane of the wafer). Also, the photo key region 12 includes second conductive patterns 20 interposed between the first conductive patterns 18 in the second direction (Y direction) and spaced apart from one another in the first and second directions. More specifically, each of the photo key regions 12 of FIG. 13 includes sets of spaced apart first conductive patterns 18 and the second conductive patterns 20 alternately disposed in the second (Y) direction, wherein the conductive patterns of each set are disposed adjacent each other in a linear array in the first (X) direction, and the conductive patterns of the alternately disposed sets are aligned in the second (Y) direction. In contrast, each of the photo key region 12 of the example of FIG. 14 includes first conductive patterns 18 and second conductive patterns 20 alternately disposed and aligned in the first and second directions (X and Y directions) such that first conductive patterns 18 are disposed adjacent each other only in a diagonal direction (oblique with respect to the X and Y directions) and the second conductive patterns are likewise disposed adjacent each other only in a diagonal direction (oblique with respect to the X and Y directions).

A method of fabricating a semiconductor device using the photo key according to the present invention will now be explained in detail with respect to FIGS. 15 through 21. The left-hand sides of these figures illustrate a cell array region at which a cell, e.g., a memory cell of a DRAM is fabricated, and the right-hand sides of these figures illustrate a region at which a photo key is formed.

Referring to FIG. 15, a cell array region and a photo key forming region are respectively defined at a first portion and a second portion of a semiconductor substrate 10, e.g., a silicon wafer. The photo key forming region may include a photo key PK as shown in FIG. 1. In any case, the photo key forming region is made up of photo key regions 12 that are spaced apart from one another in a first direction substantially parallel to the plane of the substrate 10.

Gate patterns 18a and dummy gate patterns 18 are respectively formed in the cell array region and the photo key forming region. Each of the gate patterns 18a includes a gate insulating layer (not shown) formed on the semiconductor substrate 10, a gate electrode including a polysilicon layer 3 and a metal silicide layer 5, and a gate capping layer 7 surrounding the gate electrode and comprising a nitride layer. The dummy gate patterns 18 have the same structure as the gate patterns 18a even though they are illustrated more simply in the figure.

The dummy gate patterns 18 of the photo key forming region and the gate patterns 18a of the cell array region may be formed by the same process. In the case in which the photo key has the same configuration as that shown in FIG. 1, the dummy gate patterns 18 may be formed at regions corresponding to the first regions 2, respectively, or a contiguous dummy pattern 18 may be formed over a region corresponding to the second region 4. In either case, reference will be made to each photo key region 12 as having dummy gate patterns 18, i.e., patterns that appear spaced from each other in a sectional view such as the sectional view of FIG. 2 or the sectional view of FIG. 3.

An insulating material layer is formed over and between the gate patterns 18a, the dummy gate patterns 18, and the photo key regions 12. The insulating material layer is then subjected to a CMP process in which the gate patterns 18a and the dummy gate patterns 18 are used as an etch stop layer to form first insulating layer 22. Thus, the dummy gate patterns 18 prevent the height h1 of the photo key regions 12 from being reduced when the CMP process is performed to form the first insulating layer 22.

Referring to FIGS. 16 and 17, those portions of the first insulating layer 22 buried between the gate patterns 18a and between the dummy gate patterns 18 are etched away by photolithography to form contact holes 24 through which portions of the semiconductor substrate 10 in the cell array region and the photo key forming region are exposed. That is, portions of the semiconductor substrate 10 between the gate patterns 18a in the cell region are exposed, and portions of the semiconductor substrate 10 between the dummy gate patterns 18 in the photo key forming region are exposed. Next, a conductive layer 26, for example, a polysilicon layer doped with impurities, if formed over the entire surface of the semiconductor substrate 10 as shown in FIG. 17, thereby filling the contact holes 24.

Referring to FIG. 18, the conductive layer 26 is subjected to a CMP in which the gate patterns 18a and the dummy gate patterns 18a are used as an etch stop layer. The height h1 of the photo key regions 12 is prevented by the dummy gate patterns 18 from being reduced during the CMP of the conductive layer 26. At the same time, the dummy gate patterns 18 prevent the first insulating layer 22 in the photo key regions 12 from being etched. Thus, again, the height h1 of the photo key regions 12 is prevented from being reduced.

As a result, a conductive pad pattern 20a is formed between the gate patterns 18a in the cell array region. Also, dummy pad patterns 20 are formed between and to the outside each set of dummy gate patterns 18 in the photo key forming region. The photo key regions 12 now constitute a photo key PK that will be used to align the pattern formed in the cell array region with a pattern to be formed in a subsequent process.

Next, a second insulating layer 28 is formed on the conductive pad pattern 20a, the gate patterns 18a, the first insulating layer 22, and the photo key regions 12.

Referring to FIG. 19, the second insulating layer 28 is etched by performing photolithography. In this process, the photo key regions 12 constitute a transmissive photo key. More specifically, exposure equipment transmits laser light through the semiconductor substrate 10, and the light transmitted by the photo key produces an optical signal. The optical signal is analyzed to "recognize" the photo key, i.e., to determine the location of the photo key relative to the exposure equipment. In particular, the photo key is recognized due to the contrast between the photo key regions 12 and the regions at which the second insulating layer 28 is juxtaposed with the first insulating layer 22. The exposure equipment is then aligned with the substrate 10, i.e., with the gate patterns 18a, using the recognized photo key. The first and second insulating layers 28 are then subjected to photolithography.

Accordingly, second contact holes 30 are formed. The second contact hole 30 in the cell array region exposes the conductive pad pattern 20a between the gate patterns 18a. That is, a portion of the second insulating layer 28 in the cell array region is etched away to form a contact hole 30 that exposes the conductive pad pattern 20a. At the same time, a portion of the first insulating layer 22 and the second insulating layer 28 in the photo key forming region is also etched away to expose the photo key regions 12. Alternatively, though, the second contact holes 30 which expose of the photo key regions 12 may be formed by a process different than that used to form the contact hole 30 that exposes the conductive pad pattern 20a. In any case, each of the photo key regions 12 will still be made up of a plurality of dummy gate patterns 18 spaced apart from one another and a plurality of dummy pad patterns 20 formed between and to the outside of the dummy gate patterns 18 as described above.

Referring to FIG. 20, an opaque conductive layer 23, for example, a tungsten layer, is formed over the entire surface of the semiconductor substrate 10 so as to cover the photo key regions 12 and fill the second contact hole 30 in the cell array region.

Referring to FIG. 21, a photolithography is performed such that the conductive layer 23 is etched to form a conductive line 23a on the conductive pad pattern 20a between the gate patterns 18a. The conductive line 23a may serve as a bit line in the DRAM. Segments 23a of the conductive layer are left in the photo key forming region between the photo key regions 12

At this stage, the photo key regions 12 are used as a stepped photo key. Specifically, the laser light directed by the exposure equipment onto the substrate 10 is reflected by the segments 23a of the conductive layer in the photo key forming region, and the reflected light produces an optical signal which is analyzed. Such an analysis can discern the difference in height between the photo key regions 12 and sections of the photo key forming region where no photo key regions 12 are present. At this time, note, the dummy gate patterns 18 and/or the dummy pad patterns 20 have prevented the height h1 of the photo key regions 12 from being reduced during the CMP process/processes. Thus, the height h1 of the photo key regions remains known and hence, the photo key regions 12 can serve reliably as a stepped photo key. That is, the photo key can be "recognized" with a high degree of precision. A photolithography process is performed using the recognized photo key to align the exposure equipment with the substrate 10 (e.g., with the pattern that has already been formed in the cell array region).

FIG. 22 illustrates a stage of another embodiment of a method of fabricating a semiconductor device using a photo key according to the present invention.

This embodiment includes the same steps shown in and described with reference to FIGS. 15 through 20. Next, referring to FIG. 22, the conductive layer 23 is subjected to a CMP process, in which the gate patterns 18a and the dummy gate patterns 18 are used as an etch stop layer, to form a conductive plug 23b between the gate patterns 18a in the cell array region and to form a third conductive pattern 23b outside the dummy pad patterns 20 in the photo key forming region. At this time, i.e., during the CMP process, the dummy gate patterns 18 and/or the dummy pad patterns 20 prevent the height h1 of the photo key regions 12 from being reduced. Therefore, the photo key regions 12 can be used as a stepped photo key in a subsequent photolithography process as will be described below.

A second conductive layer (not shown) is formed on the conductive plug 23b and over the photo key forming region, and is etched by performing a photolithography process to form a second conductive line 23c on the conductive plug 23b between the gate patterns 18a. The exposure equipment used to carry out the exposure part of the photolithography process is aligned with the conductive plug 23b using the photo key regions 12 as a stepped photo key. The second conductive line 23c may serve as a bit line in the DRAM.

According to the present invention as described above, conductive patterns are formed on a substrate, e.g., a silicon wafer, in each photo key region of a photo key. The photo key itself may be formed along a line such as a scribe line on the substrate. The conductive patterns may be "inserted" into photo key regions of a conventional photo key, or a photo key made up of conductive patterns according to the present invention may be formed adjacent to a conventional photo key. The conductive patterns may be dummy gate patterns and dummy pad patterns respectively formed when a gate and a gate pad are fabricated on the substrate.

In any case, the conductive patterns prevent the height of the photo key from being reduced during a CMP process, for example. As a result, the photo key can continue to be read by exposure equipment as the semiconductor device is being fabricated and thus, the exposure processes used to fabricate the semiconductor device can be carried out with a high degree of reliability.

Finally, although the present invention has been particularly shown and described with reference to the preferred embodiments thereof, it will be understood that various changes in form and details may be made to the disclosed embodiments without departing from the spirit and scope of the invention as defined by the following claims.

What is claimed is:

1. A method for use in the fabricating of a semiconductor device, the method comprising:
    forming a plurality of gate patterns on a cell array region of a semiconductor substrate, and simultaneously forming dummy gate patterns in each of photo key regions spaced apart from one another on a photo key forming region of the substrate located outside and extending along the periphery of the cell array region;
    subsequently forming a first insulating layer over the substrate which buries the gate patterns and the photo key regions;
    performing a chemical-mechanical polishing (CMP) of the first insulating layer using the gate patterns and the dummy gate patterns as an etch stop layer; and
    performing a photolithography-based process to remove the first insulating layer from between the gate patterns and from the photo key regions, the photolithography-based process comprising directing light towards the photo key forming region of the substrate, analyzing that portion of the light which is transmitted as an optical signal from the photo key region, and aligning exposure apparatus of photolithographic equipment with the substrate on the basis of the analysis of the optical signal.

2. The method of claim 1, further comprising:
    subsequently forming a conductive layer over the substrate; and
    planarizing the conductive layer to simultaneously form a first conductive patterns between the gate patterns on the cell array region of the substrate and second conductive patterns between the dummy gate patterns in the photo key regions.

3. A method for use in the fabricating of a semiconductor device, the method comprising:
    forming a plurality of gate patterns on a cell array region of a semiconductor substrate;
    forming a plurality of dummy gate patterns in each of photo key regions spaced apart from one another on a photo key forming region of the substrate, wherein the photo key forming region of the substrate is located outside and extends along the periphery of the cell array region;
    forming a first insulating layer that insulates the gate patterns and the photo key regions;
    forming a conductive pad pattern between the gate patterns on the cell array region;
    forming a plurality of dummy pad patterns between the dummy gate patterns in each of the photo key regions;
    forming a second insulating layer which covers the conductive pad pattern, the gate patterns, the first insulating layer, and the photo key regions; and
    forming a contact hole that extends through the second insulating layer and exposes the conductive pad pattern by performing a photolithography-based process, the photolithography-based process comprising directing light towards the photo key forming region of the substrate, analyzing that portion of the light which is transmitted as an optical signal from the photo key region, and aligning exposure apparatus of photolithographic equipment with the substrate on the basis of the analysis of the optical signal, whereby the dummy gate patterns and the dummy pad patterns are used as a transmissive photo key in the photolithography-based process.

4. The method of claim 3, wherein the forming of the gate patterns comprises forming a gate insulating layer on the semiconductor substrate, forming a gate electrode on the gate insulating layer, and forming a capping layer around the gate insulating layer and the gate electrode, and wherein the dummy gate patterns are formed at the same time as the gate patterns such that each of the dummy gate patterns has the same composition as each of the gate patterns.

5. The method of claim 3, wherein the first insulating layer is formed by forming insulating material between the gate patterns, the dummy gate patterns, and the photo key regions and performing a chemical-mechanical polishing (CMP) of the insulating material using the gate patterns and the dummy gate patterns as an etch stop layer.

6. The method of claim 3, wherein the conductive pad pattern and the dummy pad patterns are both formed by:
    etching the first insulating layer to form in the cell array region a contact hole which extends between the gate patterns and exposes the semiconductor substrate, and to form in the photo key regions holes which extend between the dummy gate patterns and expose the semiconductor substrate;
    forming a conductive layer that fills the holes which expose the semiconductor substrate; and
    performing a chemical-mechanical polishing (CMP) process on the conductive layer using the gate patterns and the dummy gate patterns as an etch stop layer.

7. The method of claim 1, wherein the gate patterns on the cell array region of the substrate and the dummy gate patterns on the photo key forming region of the substrate are formed by the same process.

8. The method of claim 1, wherein the photo key regions are constituted on the photo key forming region of the substrate by one of a plurality of first regions spaced apart from each other in a given direction, and a second region surrounding the first regions, and
    the first insulating layer is formed in the other of the first regions and the second region on the photo key forming region of the substrate.

9. The method of claim 3, wherein all of the dummy gate patterns in the photo key region are sandwiched in the first direction between a set of the dummy pad patterns such that the set of the dummy pad patterns is disposed on the outside of the dummy gate patterns.

10. The method of claim 3, wherein the dummy gate patterns are formed of linear patterns extending longitudinally in a first direction perpendicular to the first direction.

11. The method of claim 3, wherein the dummy gate patterns are formed of linear patterns extending longitudinally in a second direction.

12. The method of claim 3, further comprising etching the second insulating layer away from the photo key regions and etching the first insulating layer away from between the photo key regions to expose the photo key regions;

forming over the entire surface of the semiconductor substrate a conductive layer which fills the contact hole in the cell array region and covers the photo key regions conformally; and subsequently performing a second photolithography-based process comprising directing light towards the photo key forming region of the substrate, analyzing that portion of the light which is reflected from the photo key region as an optical signal, and aligning exposure apparatus of photolithographic equipment with the substrate on the basis of the analysis of the optical signal, whereby the dummy gate patterns and the dummy pad patterns are used as a stepped photo key.

13. A method of forming a combination of a semiconductor substrate and a photo key disposed on the semiconductor substrate, the method comprising:

forming the photo key having a plurality of first regions spaced apart from one another in a given direction substantially parallel to the plane of the substrate, and a second region surrounding each of the first regions, one of the first regions and the second region constituting photo key regions spaced apart from one another in the given direction, wherein the forming each of the photo key regions comprises forming first conductive patterns each of a first composition and arrayed in parallel to the plane of the substrate, and forming second conductive patterns each of a second composition different from that of the first composition, respective ones of the second conductive patterns being interposed between respective ones of the first conductive patterns; and wherein the first conductive patterns are arrayed in a first direction and in a second direction perpendicular to the first direction, and respective ones of the second conductive patterns are interposed between the first conductive patterns in at least one direction of the first direction and the second direction.

14. The method of forming the combination of a semiconductor substrate and photo key of claim 13, wherein all of the first conductive patterns in the photo key region are sandwiched in the first direction between a set of the second conductive patterns such that the set of the second conductive patterns is disposed on the outside of the first conductive patterns.

15. The method of forming the combination of a semiconductor substrate and photo key of claim 13, wherein the first conductive patterns are formed of linear patterns extending longitudinally in the first direction.

16. The method of forming the combination of a semiconductor substrate and photo key of claim 13, wherein the first conductive patterns are formed of linear patterns extending longitudinally in the second direction.

17. The method of forming the combination of a semiconductor substrate and photo key of claim 13, wherein the first conductive patterns are formed of a lattice of strips extending longitudinally and crisscrossing one another in the first and second directions.

18. The method of forming the combination of a semiconductor substrate and photo key of claim 13, the first direction corresponds to the shorter or widthwise direction of each of the photo key regions.

19. The method of forming the combination of a semiconductor substrate and photo key of claim 13, wherein all of the first conductive patterns in the photo key region are sandwiched in the first direction between a set of the second conductive patterns such that the set of the second conductive patterns is disposed on the outside of the first conductive patterns.

20. The method of forming the combination of a semiconductor substrate and photo key of claim 13, wherein each of the photo key regions includes a first photo key sub-region occupied by a first set of the first conductive patterns and respective ones of the second conductive patterns interposed therebetween, and a second photo key sub-region adjacent to the first photo key sub-region in the first direction and occupied by respective ones of the first conductive patterns and devoid of the second conductive patterns.

* * * * *